United States Patent [19]
Porter

[11] Patent Number: 5,394,242
[45] Date of Patent: Feb. 28, 1995

[54] FIBER OPTIC RESONANT RING SENSOR AND SOURCE

[75] Inventor: Bruce Porter, Sudbury, Mass.

[73] Assignee: The Charles Stark Draper Laboratory, Inc., Cambridge, Mass.

[21] Appl. No.: 451,503

[22] Filed: Dec. 15, 1989

[51] Int. Cl.[6] .......................... G01B 9/02; H01S 3/083
[52] U.S. Cl. ...................................... 356/350; 372/32
[58] Field of Search ........................ 356/350; 372/32

[56] References Cited

U.S. PATENT DOCUMENTS

| | | | |
|---|---|---|---|
| 4,120,587 | 10/1978 | Vali et al. | |
| 4,503,541 | 3/1985 | Weller et al. | 372/32 |
| 4,825,261 | 4/1989 | Schroeder | 356/350 |

OTHER PUBLICATIONS

H. W. Mocker et al, Applied Optics, vol. 28, #22, 15 Nov. '89, p. 4914.
Signal To Notise Ratio in Raman Active Fiber Systems: Applications to Recirculating Delay Lines—Emmanuel Desurvire et al—Journal of Lightwave Technology, vol. LT.4, No. 5, May 1986 pp. 560–566.
Frequency Stabilization of Semiconductor Lasers by Reasonant Optical Feedback B. Dahmani et al, Optics Letters vol. 12 No. 11, Nov. 1987 pp. 876–878.
Narrow Spectral Linewidth Semiconductors Optical-fiber Ring Laser—Shuichi Tai et al. Appl. Phys. Lett. 49 (20) 17 Nov. 1986, pp. 1328–1330.
Double—core Single-Mode Optical Fiber As Directional Coupler—G. Schniffner et al. Appl. Physics 23, 41–45 (1980).
Coupling Properties of a Double-Core Single-Mode Optical Fiber G. Schoner et al Siemens Forsch.—u. Entwicki-Ber. Bd. 10 (1981) Nr. 3 pp. 172–178.
Effect of Rayleigh Backscattering from Optical Fibers on DFB Laser Wavelength Andrew R. Chraplyvy et al—Journal of Lightwave Technology, vol. Lt.4. No. 5. May 1986 pp. 555–559.

*Primary Examiner*—Stephen C. Buczinski
*Attorney, Agent, or Firm*—Lappin & Kusmer

[57] ABSTRACT

Light from a laser diode is coupled into a fiber ring to narrow the line width. In one embodiment, Rayleigh backscattered light from the fiber is returned to the laser diode, and has the effect of greatly narrowing the diode output. In another embodiment the fiber ring is a double core ring, or a ring of plural spatially contiguous fibers. The laser diode is coupled into one core to narrow its line width, while the line-narrowed output is applied to another core which serves as a sensing device such as a gyro. Minimal or no compensation is needed to track the laser frequency to the ring resonance. In one embodiment, the first core is doped to produce a gain medium which lases at a center frequency that tracks the resonance of the sensing core as it drifts due to environmental effects.

17 Claims, 6 Drawing Sheets

FIBER OPTIC RESONANT RING SENSOR AND SOURCE

BACKGROUND OF THE INVENTION

The present invention relates to fiber optic ring sensing devices such as gyroscopes. This class of device operates by propagating a coherent, preferably polarized, light beam in an optical fiber which is coiled in a ring, and sensing the shift in phase of the light traveling in the ring. The ring may provide a multi-pass path with an effective path length tens or hundreds of times longer than the fiber length, resulting in high sensitivity.

In a basic device of this sort, the phase shift of light in the ring is detected as the frequency difference between two beams travelling in opposite directions around the ring, e.g., via the beat frequency of a travelling beam and a commonly derived reference beam. Various beam modulating and signal processing techniques may be used to quantify the frequency shift. In any case, the ability to resolve this shift in an inertial sensing instrument is dependent on the initial use of a pure spectral source having a narrow line width.

The requirement for a narrow line width has generally required the use of gas or crystal laser sources, and has ruled out the use of laser diodes as sources for a fiber optic ring sensor instrument.

However, because laser diodes are extremely inexpensive, the development of a narrow line width laser diode system for a fiber optic sensor remains a desirable goal.

SUMMARY OF THE INVENTION

In accordance with one aspect of the present invention, a fiber optic ring is coupled to the lasing cavity of a laser diode to narrow its line width. The laser diode is directly coupled to a fiber optic ring and the diode line width is narrowed by feedback of light traveling in the ring. The ring may be incorporated in the sensing ring of an instrument, thus providing a new and economical sensor architecture. In one aspect of the invention, a novel laser source is provided wherein one side of the laser diode cavity is coupled without an isolator into a fiber optic ring, and is line-narrowed by the feedback of Rayleigh backscattered light from the ring. The fiber ring may be the sensing ring of a resonant fiber optic gyro (RFOG).

In another aspect of the invention, the laser diode may be coupled into a fiber core which is physically contiguous in a single coil, with the optical fiber sensing path of a FORG. This may be accomplished by employing a coil made from a double core fiber, wherein a first core of the fiber provides the line width narrowing path, and the line-narrowed laser output of the laser diode is coupled into the second core of the fiber to perform the sensing operations of the instrument. An alternate construction of this embodiment is achieved by winding two separate fibers together in a coil such that both fibers are contiguous and therefore subject to the same physical e.g., thermal and acoustic environment. In various constructions according to this aspect of the invention, the line narrowing fiber may be set up to provide Rayleigh backscattered light at a single side of the diode cavity, or may operate as a direct traveling wave feedback path between opposed ends of the cavity. In another embodiment of this latter type, the fiber may be doped to achieve a lasing effect, and the diode may serve simply to pump the lasing fiber.

By using a fiber ring for laser source line narrowing in this manner, the thermal controls to effect tracking corrections are essentially reduced to a common set of circuitry for the source and rotation sensing ring, without the need to both perform ring measurements and tune the laser to compensate for the different thermal characteristics of the separate laser and external cavities employed in prior art laser driven RFOGS.

DETAILED DESCRIPTION OF THE DRAWINGS

Figure 1A:
FIGS. 1A, 1B show two prior art laser diode narrow line sources.
Figure 1B:
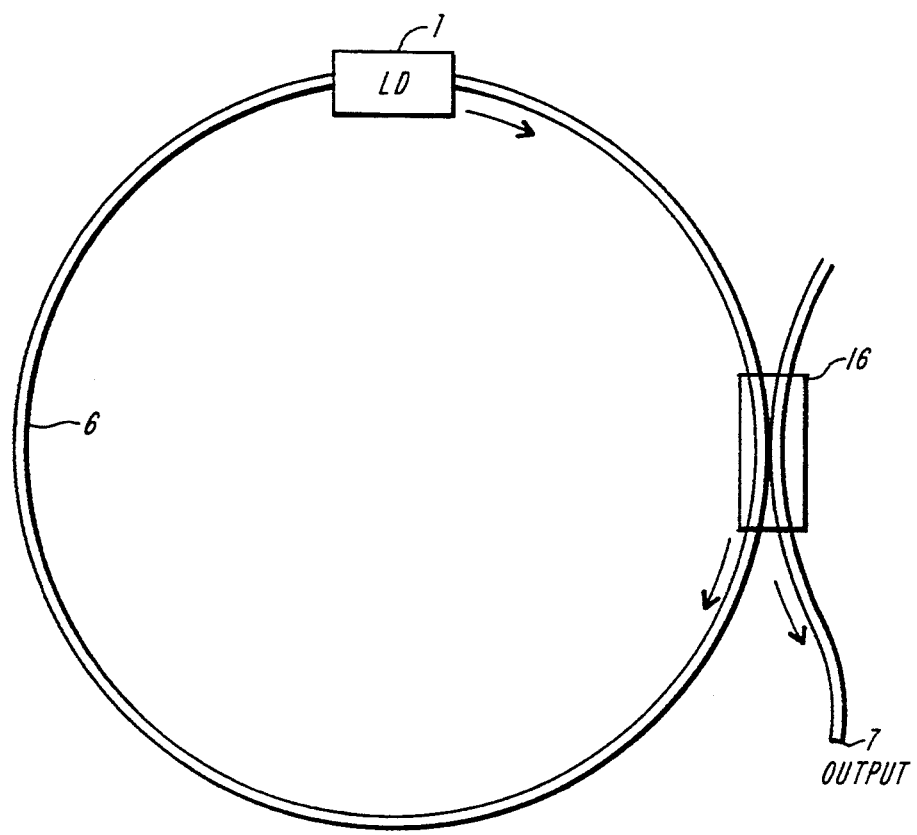

FIGS. 1A, 1B illustrate known prior art approaches to construction of line-narrowed laser diode light sources. In FIG. 1A a Fabry-Perot external resonant cavity 2 is coupled to a laser diode 1 to act as a narrow band filter that returns only a selected wavelength to the lasing cavity of the diode. The external cavity may take the form of a fiber having one silvered end 3, and a partially reflective end 4 coupled to the laser diode. The feedback wave varies as the dimension of the external cavity, i.e., the fiber length, changes, and varying degrees of line narrowing are achieved by varying the fiber length and coupling parameters.

In the construction illustrated in FIG. 1B, the ends of the lasing cavity of a diode 1 are partially transmitting, and a fiber ring 6 interconnects the two ends with each other to provide a traveling wave feedback. The fiber plus the laser cavity together thus constitute a resonant ring, with all the gain lumped in the diode cavity. An output into a fiber 7 is obtained via a coupler 16 along the ring. In this construction the principal mode varies in accordance with the sum of dimensional changes of the diode cavity and the fiber length. For this reason, precise control of the output frequency requires separate monitoring and compensation circuitry to correct parameter variations for both the diode and the fiber.

In either of the constructions shown in FIG. 1A or 1B, it is the forward-propagated light in the fiber, either as reflected light from the far end 3 of the fiber (FIG. 1A) or as returned light passing through that end (FIG. 1B), which provides the feedback necessary for a coherent narrow line laser operation. Further, in each case, stable operation is dependent upon the resonant modes of the fiber cavity. Environmental effects on the fiber (e.g. temperature, acoustics, etc.) will cause instabilities in the laser source output frequency. When using such a prior art system as a laser source for an instrument or a communications line, an optical isolator is generally required at the output 7.

In contrast to these prior art constructions, applicant has found that an entirely different approach produces a high degree of line narrowing with significant simplifications of instrument design.

Figure 2:
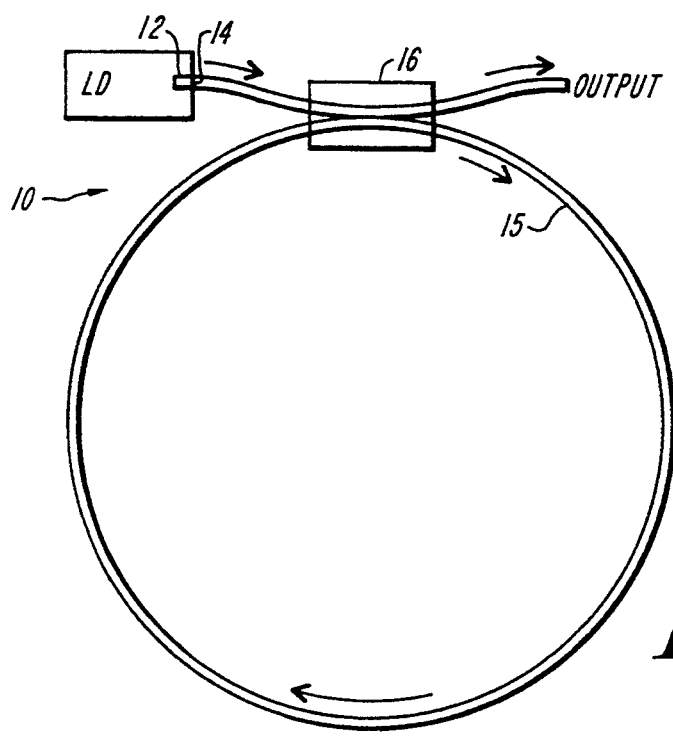
FIG. 2 shows a laser diode source stabilized in accordance with the present invention.

FIG. 2 shows a stabilized laser diode source 10 in accordance with one aspect of the present invention, wherein a laser diode has a laser cavity 12 with one end wall 14 coupled to a multi-pass fiber ring 15 in such a manner that only backscattered light from the fiber returns to the diode cavity 12. The ring 15 preferably has a reasonably high finesse, e.g. F=100, so that a twenty-five or thirty-five meter fiber coil presents an effective path length of several kilometers. A coupler 16 couples the light from the diode cavity 12 into the ring 15, with a coupling ratio that preferably couples a high proportion of the forward-propagating light into the fiber, and allows return of a high proportion of the backscattered light to the diode cavity. In distinction from the prior art configurations discussed above, no forward-propagating light is returned to the diode, so that the line-narrowing feedback consists essentially entirely of Rayleigh backscattered light. Applicant has found the line-narrowing effect of backscattering from a tightly coupled very long fiber path in this manner to result in very narrow diode line width.

In one preferred embodiment, the fiber ring used as an external light path to narrow the diode line width also functions as the ring resonator of a fiber optic ring gyro. The forward-propagating light is processed to determine inertial data, while the Rayleigh backscattered light returns to the lasing cavity of the diode as described above to narrow the line width of the diode output.

Figure 3:
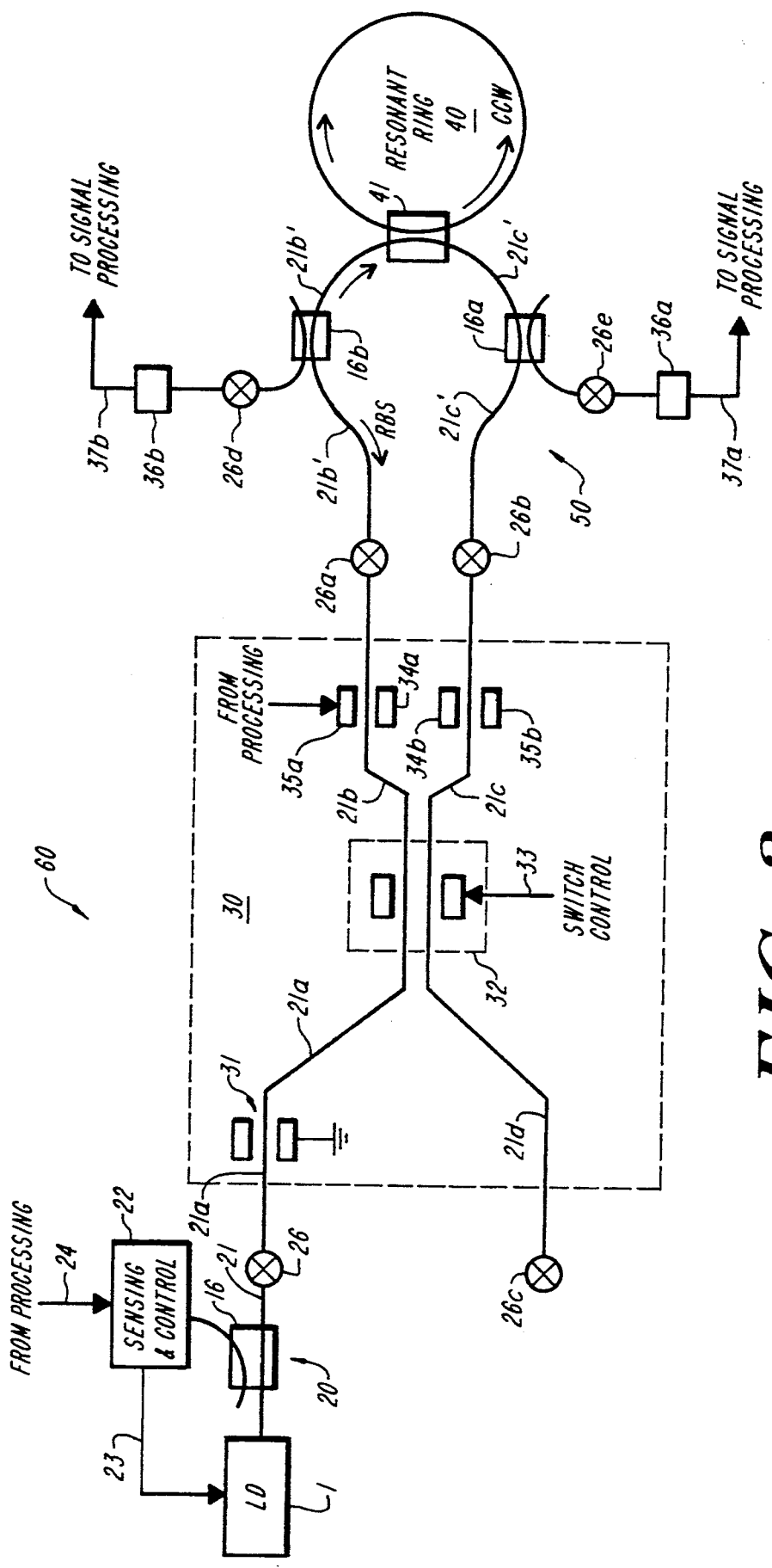
FIG. 3 shows a preferred embodiment of a ring sensor utilizing the laser source of FIG. 2.

FIG. 3 shows such an embodiment of a fiber optic ring gyro system 60 in which the sensing and feedback rings are identical. In this embodiment, a laser diode source 20 has an output path 21 which is coupled without any optical isolator into a resonant ring 40 used as an inertial sensor. By way of completeness, an entire system is shown, which, in alternate time intervals, directs clockwise and counterclockwise beams into the ring 40, with conditioning elements 30 and detection elements 50. As shown, the laser diode source 20 comprises a laser diode 1 with its output along path 21 coupled via coupler 16 to an output sensing and control circuit 22 which adjusts the diode current provided along line 23 to maintain a stable diode output. Control circuitry 22 may receive control signals 24 from ring signal processing circuitry, and other feedback in a known manner. Output path 21 couples via fiber optic connector 26 into a path along switching, condition and detection elements that is bidirectionally coupled via a resonant coupler 41 into resonant ring 40. The connector 26, and other like connectors 26a, 26b and 26c serve only to indicate the generally modular or separate nature of the different sub-assemblies or components of a FORG. For expository purposes, the various successive path segments appearing between the connectors 26, 26a, 26b, 26c may, except in the discussion of switching below, be regarded as one continuous optical fiber and the connectors themselves disregarded.

Returning to FIG. 3, the laser diode output on path 21a passes through discriminant generation element 31 and proceeds along path 21a to an electro optic switch 32 which operates in time division multiplex defined by a control signal on line 33 to direct the light either into a first path 21b or a second path 21c. Viewed in the input sense, these will be referred to as the CCW input path and the CW input path, since, as is apparent from the drawing, the forward travelling light in these paths couples via coupler 41 into ring 40 in counterclockwise and clockwise senses, respectively. The various signal conditioning and detecting elements positioned along the CCW or CW lines are identical, and only one set will therefore be described, it being understood that in alternate cycles alternate ones of them are used to perform the same general functions on one of the two (CW or CCW) beams.

Light traveling along path segments 21b, 21b' is frequency tuned with a sawtooth phase modulation waveform by serrodyne driver 34a and is suppressed carrier phase modulated by modulator 35a before passing to resonant coupler 41 and coupling into ring 40 as a counterclockwise propagating beam, denoted by the long arrow CCW. The CCW beam traveling in the ring is coupled out by the same coupler 41 and proceeds to the left as viewed in the drawing along the lower path segment 21c'. A 50/50 output coupler 16a diverts a portion of this light to the CCW detector/preamplifier 36a, the output of which is fed along line 37a to a signal processor as shown. The remaining portion of the CCW beam proceeds unused along path segments 21c' 21c and 21d. While the CCW input fiber 21b is being used, Rayleigh backscattered light from the ring 40 propagates in a clockwise direction around the ring, as indicated by the small arrow labelled RBS, and is coupled back out via resonant coupler 41 to travel in the reverse direction back along path 21b', 21b, 21a and 21 to the laser diode. In this manner, the FORG sensing ring itself provides feedback to narrow the line width of laser diode 1.

In alternate cycles, light along the input path 21 is coupled into segments 21c, 21c' to provide a CW beam to the ring. In that case, beam modulating elements 34b, 35b, and via coupler 16b the sensing element 36b are operative, and a stabilizing CCW-backscattered signal proceeds back along path 21c', 21c, 21a and 21 to the laser diode. Thus in both CW and CCW operation, the laser diode is stabilized by Rayleigh backscattered light directly from ring 40.

The serrodyne signal frequency applied to 34b and 35b is fixed, whereas the frequency applied to 34a and 35a is modulated by the signal processing to track the CCW resonant frequency of the fiber ring. It will be observed that in the architecture of the device of FIG. 3, all elements to the right of laser input connection 26 are conventional. Significantly, however, a simple laser diode and its current control feedback loop for tracking the CW resonant frequency are the only input to the device, and unlike most RFOG designs, an optical isolator is neither required nor desirable. A hybrid design is also feasible, using the backscatter-stabilized source of FIG. 2 in place of the diode source 20 of FIG. 3. In that case, one or more isolators may be used, and the sensing ring 40 may operate in an entirely conventional manner.

A second and related embodiment, employs a fiber ring which is either made from a double-core fiber, or consists of a pair of fibers wound together to form a coil in which the two fibers are contiguous and follow substantially identical winding paths so that they are subject to identical environmental (e.g., thermal and acoustic) conditions. In this embodiment, one core or fiber is coupled to a laser diode as a line-narrowing external resonant cavity, which causes the laser diode output to have a narrow line spectrum. This output is coupled into the second fiber or core of the ring and is subjected to signal processing of a known type, such as a serrodyne modulation, mixing, and demodulation, to detect a frequency shift indicative of ring rotation. In this embodiment, the feedback ring preferably returns a direct, forward propagating feedback signal to the diode cavity, rather than a Rayleigh backscattered light signal. However, great simplifications in control and compensation circuitry are achieved since the mode shifts of the first core are identical to those induced in the second core by thermal, acoustic or other environmental effects. Thus one set of frequency control circuitry may compensate both the sensing fiber and the feedback fiber.

The advantages of this construction may be understood as follows. The line width $\Delta \nu$ of a laser tuned by a resonant cavity is related to the passive resonator full width half maximum, $\Delta \nu_{\frac{1}{2}}$, according to the equation $$\Delta \nu = \pi h \nu_0 \frac{(\Delta \nu_{\frac{1}{2}})^2}{P} \left( \frac{N_2}{N_2 - N_1} \right) \quad (1)$$

Where P is the optical power generated in the lasing medium, $N_2$ ($N_1$) is the population density of the upper (lower) laser level, and $h\nu_0$ is the energy per photon. The quantity $\Delta \nu_{\frac{1}{2}}$ is given by:

$$\Delta \nu_{\frac{1}{2}} = \frac{c \alpha}{2 \pi l} \quad (2)$$

where l and $\alpha$ are the cavity length and loss per pass, and c is the velocity of the light in the medium. Equations (1) and (2) apply equally well for linear external cavity diode lasers and ring resonator narrowed diode lasers. A high performance gyro will require that $\Delta \nu$ be minimized to perhaps below 20 kHz.

From Equation (1) it follows that narrowest laser line widths are obtained from a resonator with a narrow line width. Equation (2) implies that, when cavity losses are largely independent of length (such as when coupler losses dominant over fiber rings losses), narrower line widths can be obtained for longer cavity lengths. The ring resonator can be made 35 meters or more in length, and thus will produce narrower diode laser line widths than are available from other external cavity configurations. For these reasons, a ring resonator narrowed diode laser offers advantageous packaging and performance capability for a high performance gyro.

Figure 4:
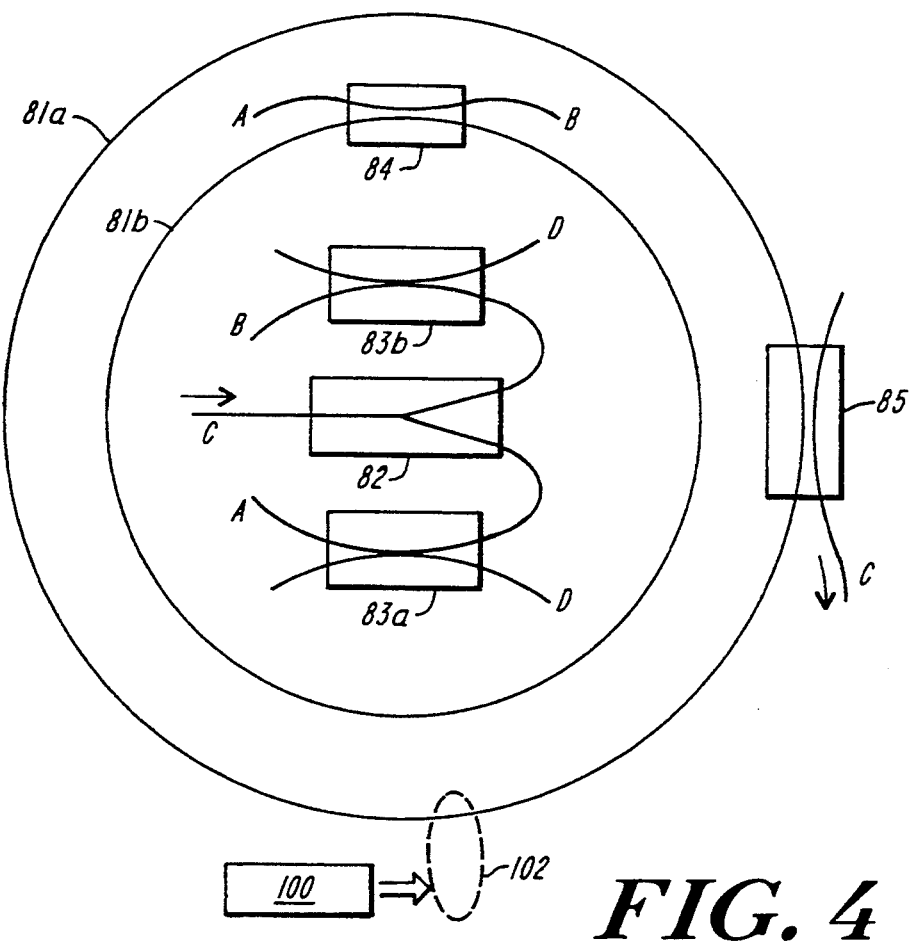
FIG. 4 shows a ring sensor architecture according to another aspect of the invention.

Turning now to the second aspect of the invention, FIG. 4 illustrates in bare schema the architecture of a FORG wherein two different but essentially unseparated ring paths 81a, 81b are used for line-narrowing and for inertial sensing, respectively. A laser 100 is coupled to a first ring 81a by a coupling arrangement indicated schematically by 102 to achieve a narrow line width, and the laser output is coupled via output coupler 85 and fiber C into the second ring 81b which serves as the sensing ring of an RFOG. The coupling arrangement may take the laser output directly from ring 81a, and may include source monitoring and conditioning elements of the type described above. Similarly, light which has traversed ring 81b is detected and demodulated by RFOG output processing elements which, as in the preceeding Figure, may overlap to some extent with the monitoring and conditioning elements along the input coupling path.

As illustrated, the clockwise propagating beam in ring 81a is coupled out along a fiber C to a signal conditioning module 82 which frequency shifts and modulates the light from input fiber C to provide two distinct signals on fibers A and B which are coupled in clockwise and counterclockwise senses, respectively, into ring 81b by coupler 84. The clockwise and the counterclockwise light circulating in ring 81b are each coupled out via the same coupler traveling in the opposite sense, into the other fiber, B and A, respectively, and coupled via couplers 83b and 83a to photodetectors $D_2$ and $D_1$ for demodulation. This coupling arrangement 102 in this Figure is indicated only schematically, since, as discussed in greater detail below, different physically distinct couplings may be employed to narrow the line width, with corresponding different advantages ranging from improved packaging and performance to reductions in processing or control circuitry.

Figure 5:
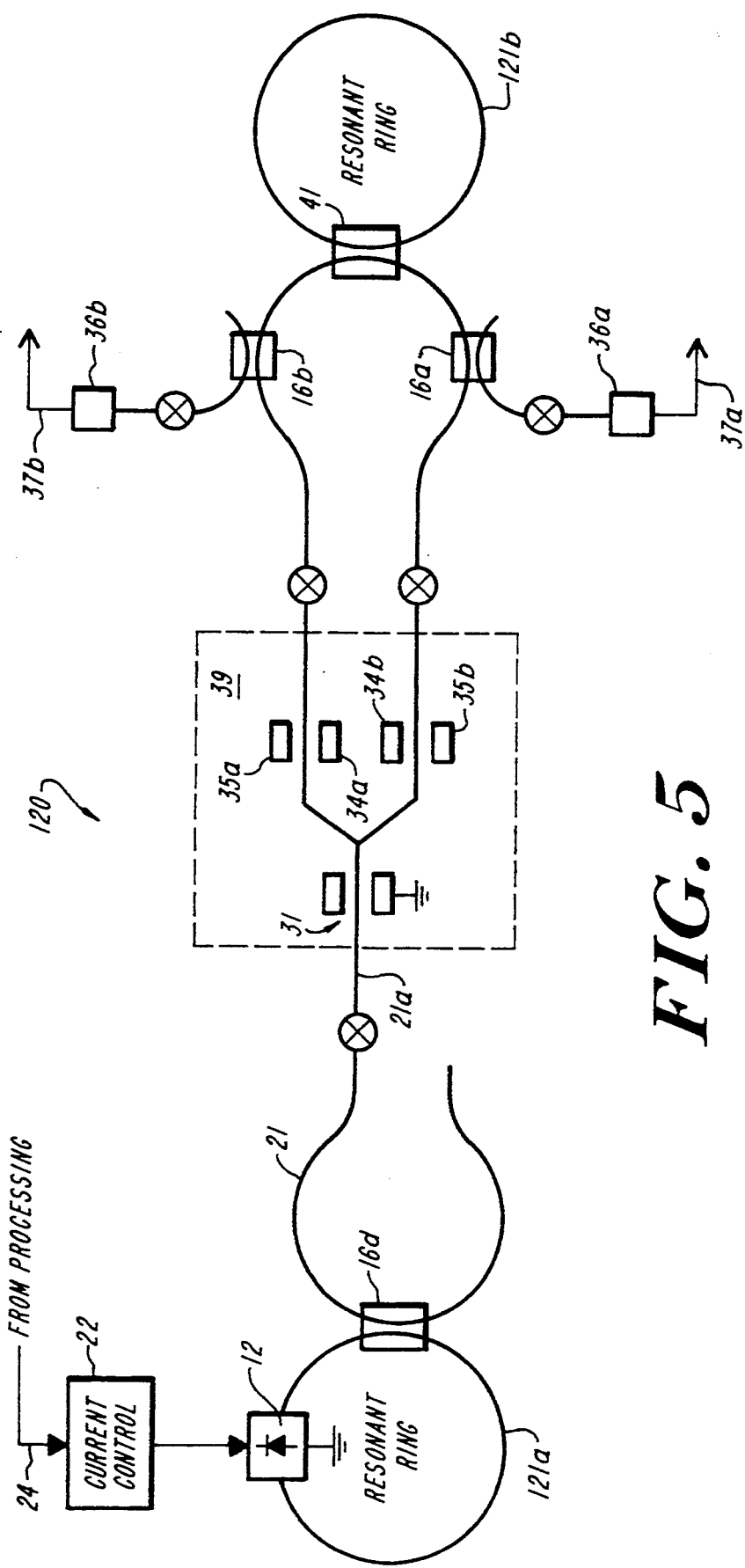
FIGS. 5 and 6 show different embodiments of a ring-stabilized laser diode sensing instrument.

FIG. 5 illustrates in greater detail one embodiment 120 of a dual ring RFOG having the general architecture illustrated in FIG. 4. In this embodiment a first ring 121a is used in a direct path between the ends of a laser diode cavity 12, thus providing a narrow line source of the type illustrated in FIG. 1B, and light is coupled out of the ring 121a by a coupler 16d as the input source to an inertial sensing ring 121b. The various elements for modulating the light fed to ring 121b and detecting and demodulating light that has traversed the ring are numbered identically to the corresponding elements shown in FIG. 3, and their operation requires no further explanation. However, certain of these elements may be fabricated as portions of an integrated optics chip 39, and this grouping is indicated in the Figure, and will be discussed further below.

In this embodiment rings 121a and 121b are separate cores of a single fiber, or are contiguous fibers which have been wound in a single ring so that their cores are separated by no more than a few hundred microns at corresponding points along their lengths. Accordingly, when thermal expansion of ring 121b causes a lengthening of the sensor's resonant path, requiring a change in the laser input frequency to maintain a stable mode, a substantially identical change in path length of ring 121a occurs. As a result, the resonance of the path formed by ring 121a will tune the laser by approximately the required amount to maintain a stable mode in ring 121b.

Figure 6:
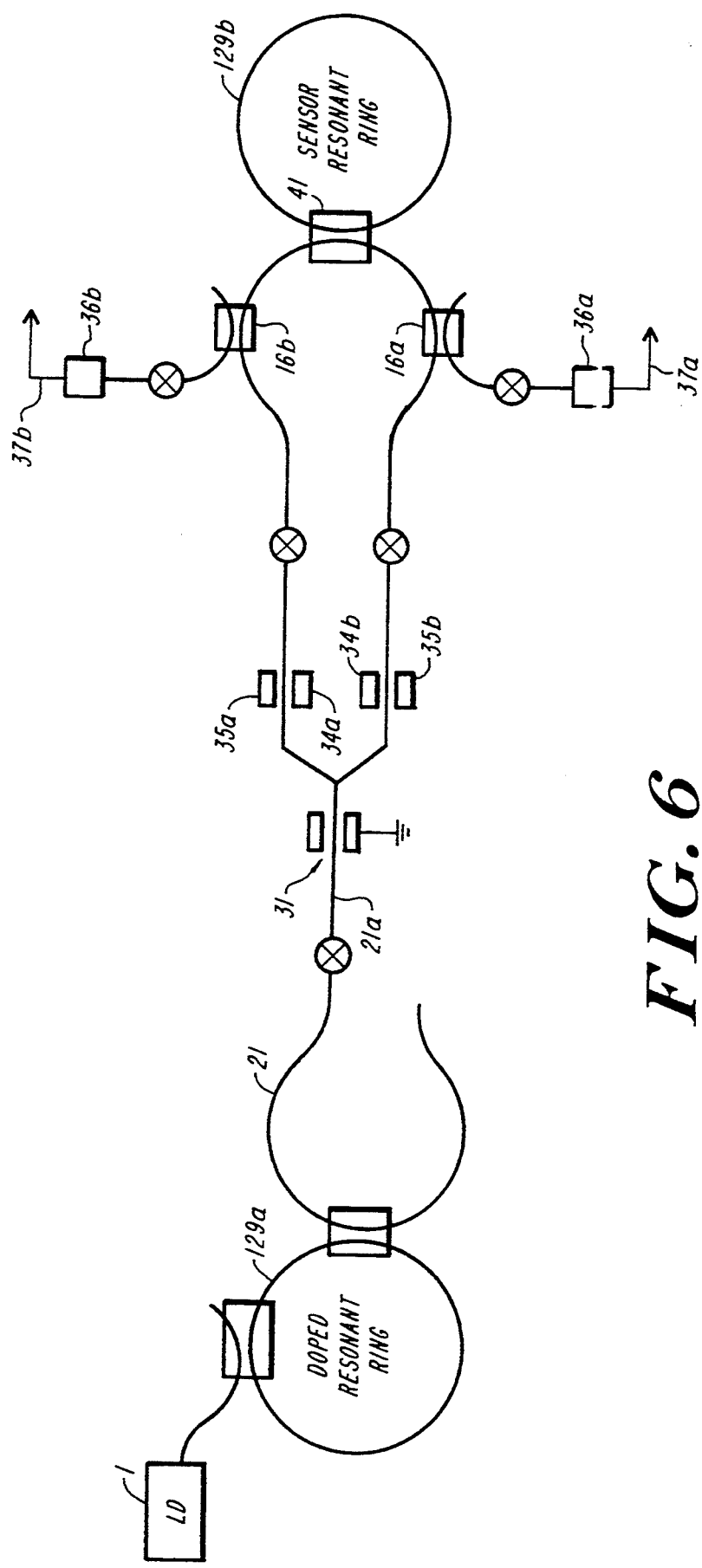

In one further embodiment of a laser diode RFOG using this double path architecture, the ring has a core which is itself a lasing medium. The core may, for example, be an Erbium-doped silica core which emits light at 1.5 microns. As in the embodiment of FIG. 6, both cores of the ring are essentially contiguous. In this further embodiment, illustrated in FIG. 6, the laser diode 1 serves only as a pump laser for the fiber ring 129a, and the output of the ring 129a is used as the input to sensing ring 129b. This construction substantially eliminates the need to compensate for the small drift that would occur in the source of FIG. 5 caused by the different thermal properties of the laser diode gain medium compared to the fiber thermal properties. In fact most problems associated with coupled resonator cavities, such as feedback and frequency tuning, are removed. Furthermore, much complexity of RFOG tuning and tracking is eliminated, since the laser center frequency of the pumped fiber core 129a tracks the resonance of fiber core 129b as their dimensions change. In fabricating such a double-core or two-fiber ring it may be desirable to alter the material used for the fiber 129b to assure that both light paths have substantially identical thermal expansion and optical index characteristics.

Figure 7:
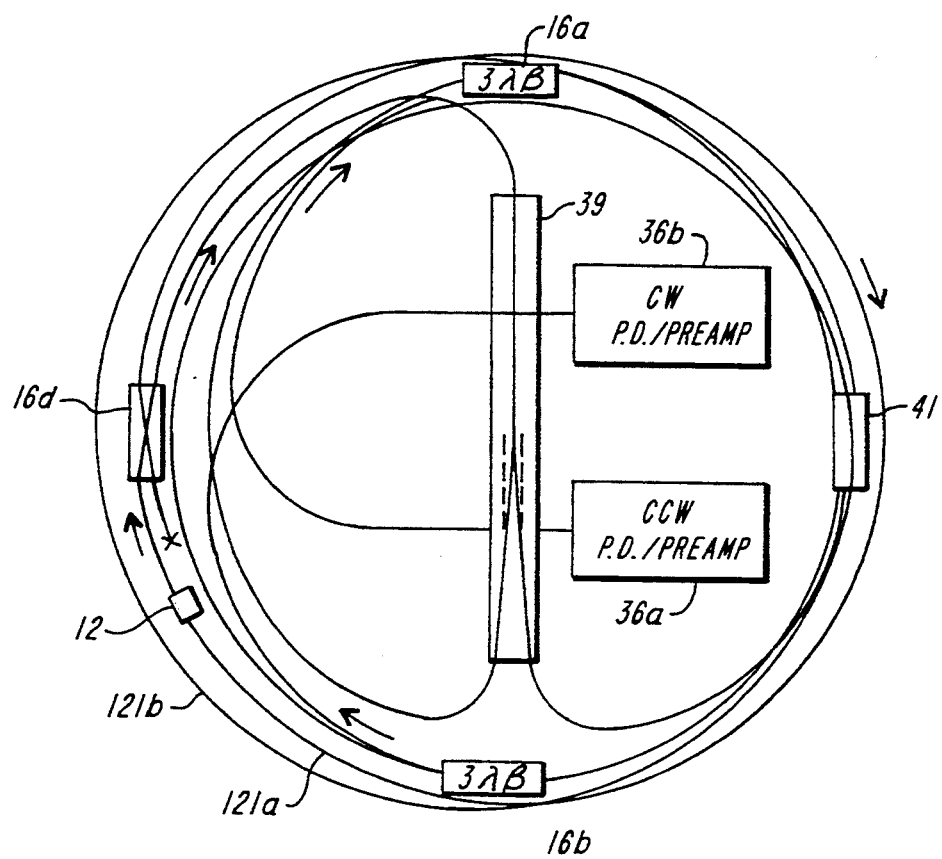
FIG. 7 illustrates the mechanical layout for a device such as shown in FIGS. 4–6.

Further advantages of the intimate double light path RFOG architecture will be apparent from FIG. 7, showing the mechanical layout for the RFOG 120 of FIG. 5. The two cores or fibers 121a, 121b of FIG. 5 which were illustrated at separate ends of that Figure for clarity of exposition, are, as described above, virtually unseparated, except for such short divergent portions as are required for passing through a coupler or through an optical processing element required by the instrument. As shown in FIG. 7, this provides a compact mechanical layout wherein both cores/fibers 121a, 121b together with the laser diode 12, both couplers 16d, 41 and couplers 16a, 16b occupy the perimeter of a disc. The photodetector/preamplifiers 36a, 36b, and an integrated optics chip 39 which performs the path switching and beam modulation occupy the central region, so that the spatial requirements of the FORG are essentially reduced to the space required for one sensing coil. Thus, the dual core device of FIG. 4 has significant packaging, as well as circuit design, advantages.

This completes a description of the invention, the teachings of which have been illustrated by reference to different embodiments of the several aspects thereof. Provided with these teachings, variations and modifications will occur to those skilled in the art, and all such variations and modifications are considered to be within the scope of the invention in which patent rights are claimed, as defined by the claims appended hereto.

What is claimed is:

1. In a resonant fiber optic gyro of the type wherein laser beams derived from a laser source are launched into a fiber ring to develop signals indicative of a frequency shift induced by a component of rotation of the inertial frame of the ring, and including feedback means operative on a said beam to maintain its frequency in a resonant mode of the fiber, the improvement wherein the laser source includes a laser diode which emits said beam as an output beam, and means for coupling said beam into the fiber ring such that only Rayleigh backscattered light from the ring returns to the laser diode and narrows the line width thereof.

2. The improvement of claim 1, wherein the fiber optic gyro contains a fiber ring having first and second parallel light conducting fiber cores, and said laser diode output beam is launched into and stabilized by light returned to the diode from said first core, and the forward propagating light of said first core is provided as a line-narrowed input beam to said second core.

3. A laser source comprising a laser diode having a lasing cavity with one end thereof tightly coupled into a resonant fiber optic ring such that the diode receives only Rayleigh backscattered light from the ring, in an amount effective to narrow the line width of light produced by the laser diode, forward propagating light in the ring constituting a line narrowed output of said laser source.

4. The source of claim 3, attached as an input to a fiber optic sensing device.

5. An improved fiber optic sensor, of the type wherein laser beams derived from a laser source are propagated in a fiber ring to develop signals indicative of a physical state sensed by the ring, and including feedback means operative on a said beam to maintain its resonant frequency in a resonant mode of the ring, wherein the improvement resides in that the fiber ring is a resonant ring formed as a coil having first and second essentially contiguous light conducting cores and said first core is coupled to a laser diode cavity to narrow the line width of the laser diode, the line width narrowed output of the laser diode being provided as an input to said second core, said laser beams being propagated in said second core to develop said signals.

6. An improved fiber optic sensor according to claim 5, wherein said first and second cores are cores of a single fiber.

7. An improved fiber optic sensor according to claim 5, wherein said first and second cores are cores of respective first and second fibers which are contiguously wound together in a ring along a single winding path.

8. An improved fiber optic sensor according to claim 5, wherein said first and second cores are single mode, polarizing, or polarization maintaining cores.

9. An improved fiber optic sensor according to claim 5, wherein said first core is coupled between opposed ends of the laser diode cavity to provide a coupled resonator for narrowing the line width of the diode.

10. An improved fiber optic sensor according to claim 5, wherein said first core is formed of a lasing medium which is pumped by the laser diode and lases at a frequency different from that of the laser diode.

11. An improved fiber optic sensor according to claim 10, wherein said second core has thermal characteristics matching said first core, so that the ring laser frequency tracks the resonance of the second core.

12. An improved fiber optic sensor according to claim 5, wherein said first core is coupled to provide only backscattered light to said laser diode for narrowing said line width.

13. An improved sensor according to claim 5, wherein said sensor is a resonant fiber optic gyro.

14. An improved method of providing a coherent source of light, wherein the improvement comprises the steps of
  i) coupling a light output of a laser diode as a forward propagating beam along a path into a resonant fiber optic ring such that the laser diode receives only Rayleigh backscattered light along the path in an amount effective to narrow its line width, and
  ii) coupling a portion of said forward propagating beam as a light output thus constituting a line narrowed coherent source of light.

15. An improved method of performing high resolution sensing of an inertial parameter via a resonant fiber optic ring, wherein the improvement comprises forming said ring with first and second fiber cores in parallel along an essentially common contiguous winding path, circulating light in said first core to develop a reference laser source, and providing said reference laser source to said second core for sensing of the inertial parameter.

16. The improved method of claim 15, wherein the step of circulating light in said first core includes coupling said first core as an external Fabry-Perot cavity to a laser diode to narrow the laser diode line width.

17. An improved method of sensing a parameter with a resonant fiber optic ring, wherein the improvement comprises coupling a laser diode to the ring to receive only Rayleigh backscattered light therefrom in an amount effective to narrow the line width of the laser diode thereby achieving a narrow line output, and applying said narrow line output to develop a sensing beam.

* * * * *